(12) United States Patent
Huang

(10) Patent No.: US 7,049,705 B2
(45) Date of Patent: May 23, 2006

(54) CHIP STRUCTURE

(75) Inventor: Min-Lung Huang, Kaohsiung (TW)

(73) Assignee: ADVANCED Semiconductor Engineering, Inc., Kaohsiung (TW)

( * ) Notice: Subject to any disclaimer, the term of this patent is extended or adjusted under 35 U.S.C. 154(b) by 4 days.

(21) Appl. No.: 10/710,401

(22) Filed: Jul. 8, 2004

(65) Prior Publication Data

US 2005/0012222 A1    Jan. 20, 2005

(30) Foreign Application Priority Data

Jul. 15, 2003 (TW) ................. 92119227 A

(51) Int. Cl.
*H01L 23/48*  (2006.01)
*H01L 23/52*  (2006.01)
*H01L 29/40*  (2006.01)

(52) U.S. Cl. ............... 257/786; 257/690; 257/774; 257/776; 257/798; 257/303; 257/784; 228/180.22; 174/261; 438/612

(58) Field of Classification Search ............... 257/690, 257/774, 776, 798, 303, 784, E33.066, E21.537, 257/E23.078, 780, 786, 621, E21.538, E21.588; 228/180.22; 174/261; 438/612
See application file for complete search history.

(56) References Cited

U.S. PATENT DOCUMENTS

| | | | | |
|---|---|---|---|---|
| 5,875,102 A | * | 2/1999 | Barrow | 361/777 |
| 6,417,575 B1 | * | 7/2002 | Harada et al. | 257/784 |
| 6,583,506 B1 | * | 6/2003 | Yano et al. | 257/737 |

FOREIGN PATENT DOCUMENTS

| | | | | |
|---|---|---|---|---|
| JP | 55138872 A | * | 10/1980 | |
| JP | 57045938 A | * | 3/1982 | |
| JP | 11219954 A | * | 8/1999 | |

* cited by examiner

*Primary Examiner*—Tom Thomas
*Assistant Examiner*—Chris C. Chu
(74) *Attorney, Agent, or Firm*—Jiang Chyun IP Office

(57) ABSTRACT

A chip structure can reduce the phenomenon of overcrowding current at the conventional circular opening of the passivation layer and further causing electromigration when the current flows to the bonding pad via the transmission line. The improved structure for the side profile of the opening of the passivation layer is about a circular profile, but the portion near to the transmission line is a straight line or a curving line. When the current flows through this opening, the current density can be uniformly distributed along the straight line or the curving line, and whereby the phenomenon of overcrowding current can be reduced.

11 Claims, 2 Drawing Sheets

CHIP STRUCTURE

CROSS REFERENCE TO RELATED APPLICATIONS

This application claims the priority benefit of Taiwan application serial no. 92119227, filed Jul. 15, 2003.

BACKGROUND OF INVENTION

1. Field of Invention

The present invention relates to a chip structure. More particularly, the present invention relates to an improved passivation structure for protecting an opening.

2. Description of Related Art

In the semiconductor fabrication, the production of integrated circuit (IC) is basically divided into three stages: wafer fabrication, IC fabrication, and IC package. Wherein, a die is accomplished after the steps of wafer fabrication, circuit design, circuit fabrication, and wafer cutting. For each accomplished die, cutting from the wafer, after the bonding pads of the die are electrically coupled to external signal lines, the die is packaged. The purpose of packaging the die is to prevent the humidity, thermal energy, and noise from affecting on the die. Also and, the package also provides a way for allowing the die to be electrically coupled to the external circuit, such as the printed circuit board or other packaging substrate. As a result, packaging process on the IC is accomplished.

Referring to FIG. 1, it is a top view, schematically illustrating a conventional structure of opening in a passivation layer. Each chip (or die) 100 cutting from the wafer has multiple bonding pads 110. The bonding pads 110 are arranged on the active surface 102 of the chip 100, so as to serve as a connection terminal of the chip 100 to the external signal. In addition, in order to prevent the outmost circuit pattern 116 of the chip 100 from being damaged due to contamination and mechanical effect, the active surface 102 of the chip 100 is formed with a passivation layer 104. This passivation layer 104 is formed by, for example, depositing an organic protection material or an inorganic protection material, for covering the active surface 102 of the chip 100. Also and, the passivation layer 104 covers over a portion of surface of the bonding pad 110 and the surface of a transmission line 114. The other portion of the top surface 112 of the bonding pad 110, which portion is not covered by the passivation layer 114, has an opening being formed, so as to serve as a connection via used by the subsequent fabrication processes of forming bump or bonding.

it should be noted that the opening 106 formed in the conventional passivation layer 104 usually is a circular opening. However, when the operation speed of the chip 100 increases, it is often that a large amount of current flows to the opening 106 above the bonding pad 110 via the transmission line 114, and is gathered at the profile surface 108 of the circular opening near to the transmission line 114. This causes that the current density at the profile surface 108 is larger than the current density at other peripheral surface, and further causes the phenomenon of current overcrowding. Even more severe, for the under bump metallurgic (UBM) layer above the bonding pad 110, the metallic atoms, under a long period of current affection, have gradually flowed away due to electromigration. It even further causes an open circuit between the bonding pad 110 and the UBM layer (not shown), and affects the lifetime of the chip 100.

SUMMARY OF INVENTION

The invention provides a chip structure, so that the current density flowing through the opening of the passivation layer can be in better uniformity, and the phenomenon of overcrowding current can be reduced.

For achieving the foregoing objective, a chip structure is provided in the invention. The chip has at least a bonding pad and a transmission line coupled with the bonding pad. The bonding pad and the transmission line are disposed on a surface of the chip. In addition, the passivation layer covers over a surface of the chip and the passivation layer has an opening to expose the bonding pad. The cross-sectional profile of the opening is composed of a straight line and an arc connected to the two ends of the straight line. The straight line is near to a connection terminal of the transmission line and the bonding pad.

For achieving the foregoing objectives, the invention provides a chip structure. The chip has at least a bonding pad and a transmission line coupled with the bonding pad. The bonding pad and the transmission line are disposed on a surface of the chip. In addition, the passivation layer covers over a surface of the chip and the passivation layer has an opening to expose the bonding pad. The cross-sectional profile of the opening is composed of a curve line and an arc connected to the two ends of the curve line. The curve line is concave to the arc and the curve line is near to the connection terminal of the transmission line and the bonding pad.

According to an embodiment of the invention, the foregoing straight line and the curve line are near to the connection terminal. When the current flows to the opening above the bonding pad through the transmission line, since the cross-sectional profile of the opening include straight line or the curve line, which are not the conventional circular opening, it can be effectively avoided that the current density are gathered at the profile surface of the conventional opening. As a result, the current is rather uniformly distributed on the straight line or the curve line. This can solve the phenomenon of the current overcrowding.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
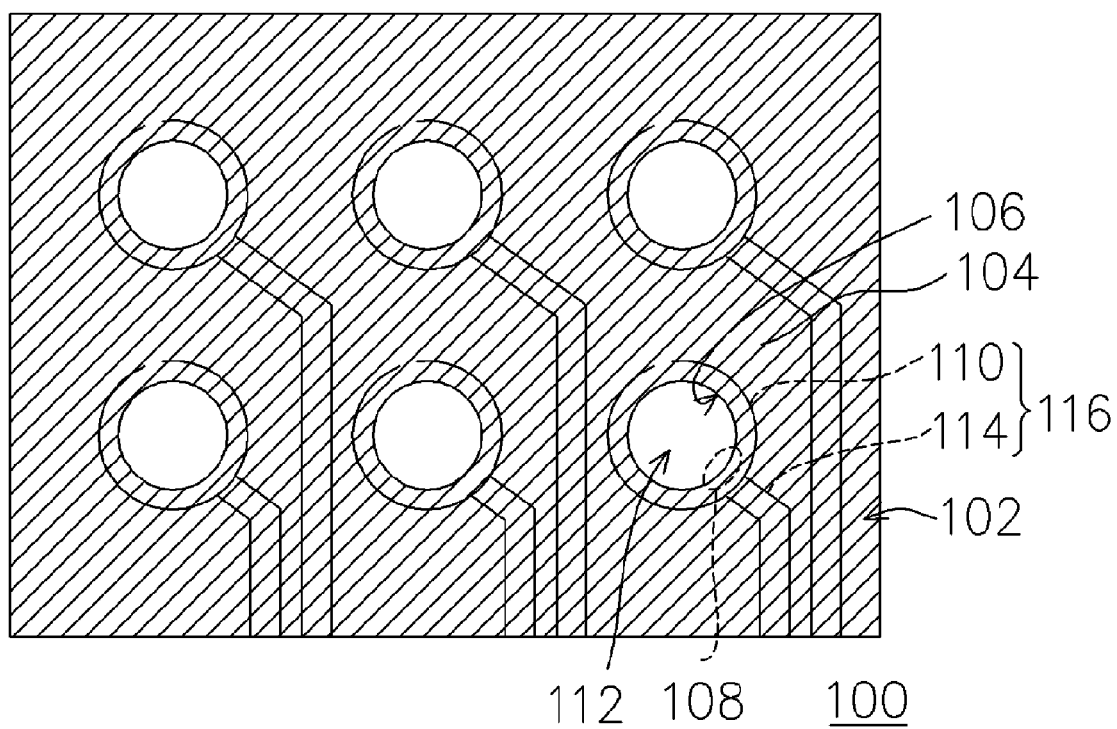
FIG. 1 is a top view, schematically illustrating a conventional structure of opening in a passivation layer.
Figure 2:
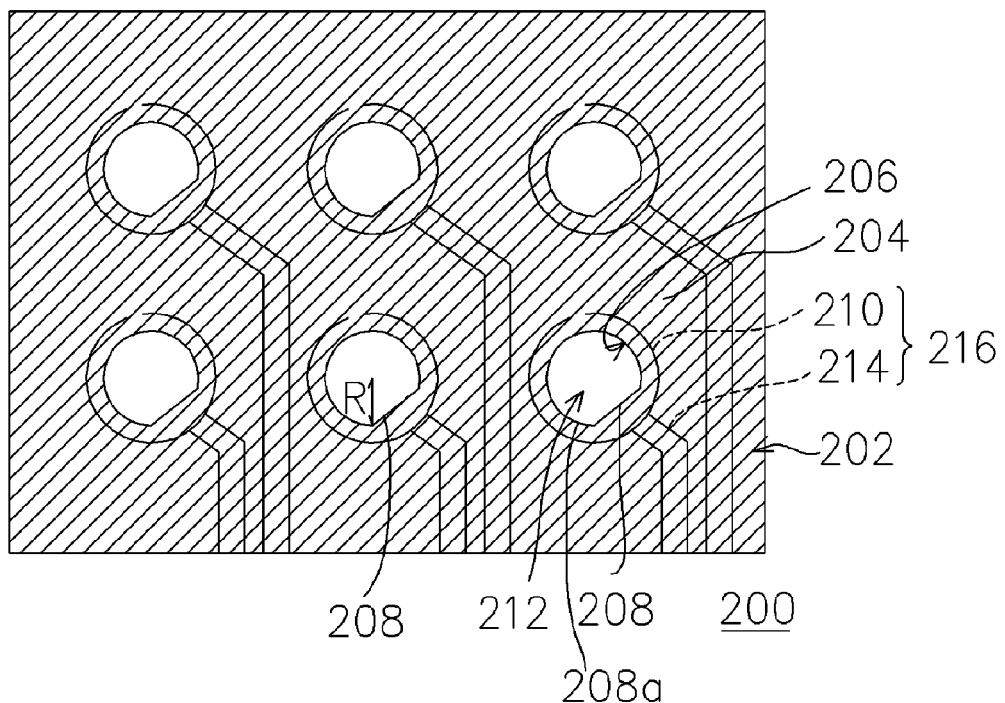
FIG. 2 is a top view, schematically illustrating a structure of opening in a passivation layer, according to an embodiment of the invention.

Referring to FIG. 2, it is a top view, schematically illustrating a structure of opening in a passivation layer, according to an embodiment of the invention. A chip 200 has multiple bonding pads 210, and the bonding pads 210 are, for example, arranged in a planar array on the active surface 202 of the chip 200, so as to serve as terminals for connecting to external signals. In addition, in order to prevent the outmost circuit pattern layer 216 of the chip 200 from being damaged due to the external contamination or mechanical effect, the active surface 202 of the chip 200 is formed with a passivation layer 204. This passivation layer 204 is formed by, for example, depositing an organic protection material or an inorganic protection material, for covering the active surface 202 of the chip 200. Also and, the passivation layer 204 covers a portion of the surface of the bonding pad 210 and the surface of the transmission 214. The other portion not being covered by the passivation layer 204 form an opening 206 above the surface 212 of the bonding pad 210, so as to serve as the connection via being used for the subsequent fabrication process for forming the bumps and bonding.

In the embodiment, the cross-sectional profile of the opening 206 of the passivation layer is composed of a straight line 208 and an arc 208a connecting to the two ends of the straight line 208. In this manner, a portion of the cross-sectional profile of the conventional circular opening 106 has been properly processed and the shape has been changed. In FIG. 2, for the procession on the opening 206, it can, for example, be that a filling method is used to have a straight line 208 on the cross-sectional profile of the opening 206 near to the transmission line 214. This straight line 208 is, for example, a string of the conventional circular opening 106, and is extending along a direction perpendicular to the transmission line 214 at the connection end with the bonding pad 210. Therefore, when the current flows through the transmission line 214 and toward the opening 206 above the bonding pad 210, since the cross-sectional profile of the opening 206 near to the transmission line 214 is a straight line but not the conventional circular shape, it can be avoided that the current density over gathers on the profile surface 108 of the conventional circular opening. Instead, the current is rather evenly distributed on the straight line 208 of the opening 206. This can reduce the phenomenon of current overcrowding. In the invention, in order to not affect the area of the conventional opening 106, the length of the straight line 208 can preferably be less than or equal to the radius R of the conventional opening 106. However, under the situation without considering the opening area, the length of the straight line 208 can also be between the diameter and radius of the arc 208a. In this situation, the opening can be approaching to the half circle.

Figure 3:
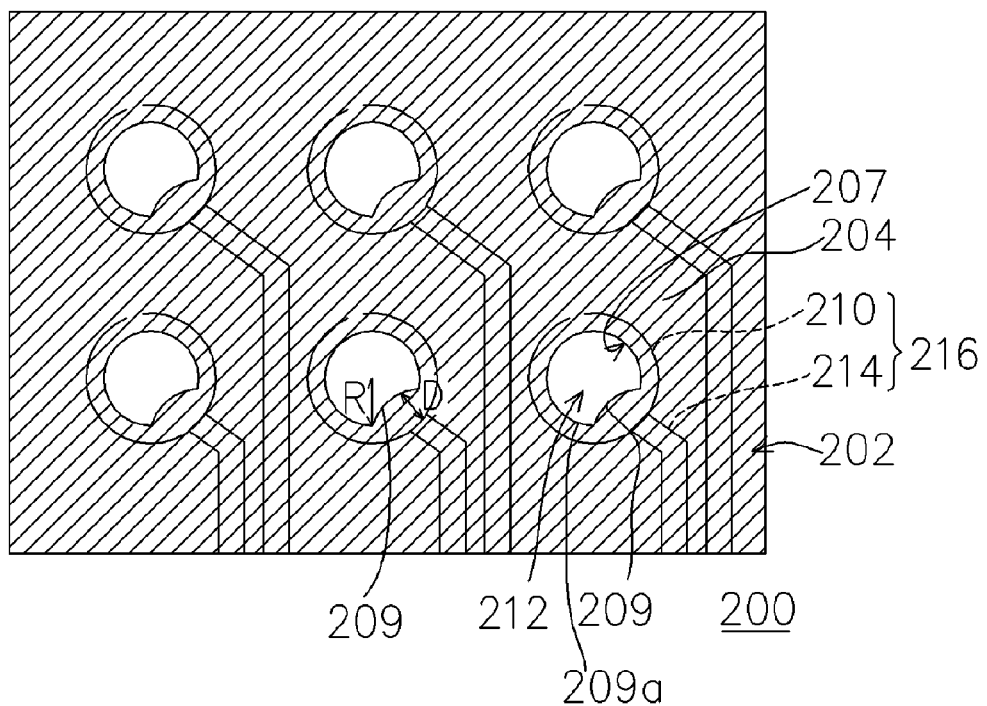
FIG. 3 is a top view, schematically illustrating a structure of opening in a passivation layer, according to another embodiment of the invention.

In addition to using the straight line for the opening 206, the invention alternatively proposes another embodiment of the opening structure in the passivation layer. Referring to FIG. 3, the chip 200 has multiple bonding pads 210. The top surface 212 of the bonding pad 210 without being covered by the passivation layer 204 has an opening 207 above. In this embodiment, the opening 207 in the passivation layer 204 is composed of a curving line 209 and an arc 209a connected to two ends of the curving line 209, wherein the curving line 209 can be concave into the arc 209a. The curving line 209 is at the location near to a connection terminal between the transmission line 214 and the bonding pad 210. Therefore, when the current flows to the opening 207 above the bonding pad 210 via the transmission line 214, since the side profile of the opening has a curving line 209 at the portion near to the transmission line 214 but not the conventional circular opening, it can be avoided that the current density overly gathers on the profile surface of the conventional circular opening 106. Instead, the current is rather evenly distributed on the curving line 209 of the opening 207. This can reduce the phenomenon of current overcrowding.

In the preferred condition, each point of the curving line 209 has an equal distance D to the connection terminal between the transmission line 214 and the bonding pad 210. In this manner, the current density on each point of the curving line 209 can have the effect of uniform distribution. In addition, in order not to affect the area of the opening 207, the length of the curving line 208 can preferably be less than or equal to the radius R of the arc 209a, and curvature of the curving line 209 can be less than or equal to the curvature of the arc 209a. However, under the situation without considering the opening area, the length of the straight line 208 can also be increased, and the curvature can be larger than the curvature of the arc 209a. Thus, the shape of the opening 207 is approaching to a crescent-like shape.

According to the foregoing descriptions, the improved structure for the side profile of the opening of the passivation layer in the invention is about a circular profile, but the portion near to the transmission line is a straight line or a curving line. As a result, when the current flows through this part, the current density can be uniformly distributed along the straight line or the curving line, and whereby the phenomenon of overcrowding current can be reduced. In addition, by the improved opening structure, the possibility of open circuit between the bonding pad and the UBM layer due to electromigration is reduced, and the chip lifetime can be prolonged.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A chip structure, at least comprising:
   a chip, having at least a bonding pad and a transmission line on a chip surface, wherein the transmission line is coupled to the bonding pad; and
   a passivation layer, covering the chip surface, wherein the passivation has an opening to expose the bonding pad, wherein a top-view profile of the opening is composed of a straight line and an arc connecting to two ends of the straight line and the arc is a segment of a circle or an ellipse, and the straight line is adjacent to a connection terminal between the transmission line and the bonding pad.

2. The chip structure of claim 1, wherein a length of the straight line is less than or equal to a radius of the arc.

3. The chip structure of claim 1, wherein a length of the straight line is between a radius of the arc and a diameter of the arc.

4. The chip structure of claim 1, wherein the passivation layer includes an organic passivation layer.

5. The chip structure of claim 1, wherein the passivation layer includes an inorganic passivation layer.

6. A chip structure, at least comprising:
   a chip, having at least a bonding pad and a transmission line coupled to the bonding pad, wherein the bonding pad and the transmission line arc on a chip surface; and
   a passivation layer, covering the chip surface, wherein the passivation has an opening to expose the bonding pad, wherein a top-view profile of the opening includes a curving line and an arc connecting to two ends of the curving line and the arc is a segment of a circle or an ellipse, wherein the curving line is concave to the arc and adjacent to a connection terminal between the transmission line and the bonding pad.

7. The chip structure of claim 6, wherein each point of the curving line has a equal distance to the connection terminal between the transmission line and the bonding pad.

8. The chip structure of claim 6, wherein a curvature of the curving line is less than or equal to a curvature of the arc.

9. The chip structure of claim 6, wherein a curvature of the curving line is greater than or equal to a curvature of the arc.

10. The chip structure of claim 6, wherein the passivation layer includes an organic passivation layer.

11. The chip structure of claim 6, wherein the passivation layer includes an inorganic passivation layer.

* * * * *